United States Patent [19]

Baker et al.

[11] Patent Number: 4,895,486

[45] Date of Patent: Jan. 23, 1990

[54] WAFER MONITORING DEVICE

[75] Inventors: Gregory G. Baker; Edward F. Boyle, both of Gig Harbor, Wash.

[73] Assignee: Roboptek, Inc., Gig Harbor, Wash.

[21] Appl. No.: 50,952

[22] Filed: May 15, 1987

[51] Int. Cl.[4] ............................................. G01P 13/00
[52] U.S. Cl. ................................... 414/331; 414/217; 414/416; 414/222; 414/226; 414/273; 414/274; 414/609; 901/47
[58] Field of Search ............... 414/416, 331, 274, 273, 414/275, 609, 610, 217, 222, 225; 901/46, 47; 118/500, 50, 50.1

[56] References Cited

U.S. PATENT DOCUMENTS

| | | | |
|---|---|---|---|
| 3,851,972 | 12/1974 | Smith et al. | 414/331 X |
| 3,902,615 | 9/1975 | Levy et al. | 414/416 X |
| 4,343,584 | 10/1982 | Hudgins | 414/226 X |
| 4,458,152 | 7/1984 | Bonora | 414/331 X |
| 4,493,606 | 1/1985 | Foulke et al. | 414/416 X |
| 4,534,389 | 8/1985 | Tullis | 414/217 X |
| 4,744,713 | 5/1988 | Hrovath | 414/222 |

FOREIGN PATENT DOCUMENTS

| | | | |
|---|---|---|---|
| 252535 | 12/1985 | Japan | 414/331 |
| 173837 | 8/1986 | Japan | 414/416 |

Primary Examiner—Frank E. Werner
Attorney, Agent, or Firm—Christensen, O'Connor, Johnson & Kindness

[57] ABSTRACT

A monitoring device for determining the presence or absence of wafer-like objects in a carrier having a plurality of shelves, each shelf being constructed to support one such object in an orientation normal to a carrier axis. The monitoring device may advantageously be used in an apparatus for handling wafer-like objects in a self-contained environment. The monitoring device includes a first detector capable of detecting movement of a body past the detector and generating a corresponding first signal. A translation member is physically coupled to the carrier, such that movement of the translation member results in movement of the carrier. The translation member is moved such that the carrier, and any objects such as wafers supported in the carrier, move along the carrier axis past the first detector. As the translation member moves, a position signal is generated, such that the position signal encodes the position of the translation member. The first detection signal and the position signal are processed to determine the presence or absence of an object on each shelf, and the position of each object. A second detector may be employed to determine whether each object is fully seated in its shelf.

9 Claims, 7 Drawing Sheets

WAFER MONITORING DEVICE

FIELD OF THE INVENTION

The present invention relates to an apparatus for handling wafer-like objects using a standardized mechanical interface mechanism, and in particular to a monitoring device and method for detecting the presence and positions of the wafer-like objects during use of such an apparatus.

BACKGROUND OF THE INVENTION

The steps involved in the manufacture of an integrated circuit include the slicing of a semiconductor crystal into thin wafers, polishing of the wafers, preparation of masks or reticles, oxidation of the wafers, doping of the semiconductor material comprising the wafers, and processing the wafers through circuit forming steps such as photolithography, etching, exposure, etc. Once the circuits have been formed on a wafer, the individual circuits are probed to confirm that they are functional, and the wafer is then cut into chips and the individual chips packaged. At any one of these steps in the manufacturing process, it may be required to visually inspect the wafers for imperfections. In the past, the manufacturing steps, including the inspections, have typically been carried out in a clean room from which dust and other airborne particles have been substantially excluded.

Figure 1:
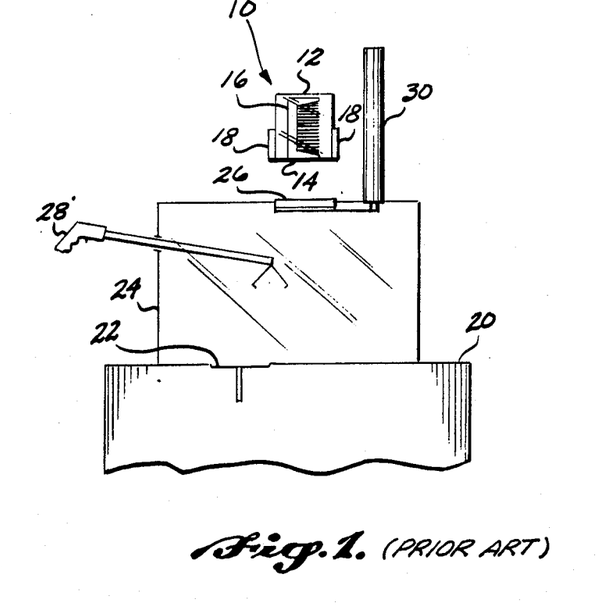
FIG. 1 is a schematic view of a prior art system that includes a standardized mechanical interface for handling of wafer storage carriers.

Recently a system has been designed to permit the handling of semiconductor wafers both inside and outside of clean rooms. The system incorporates a standardized mechanical interface, and is commonly referred to by the acronym SMIF. The SMIF system includes dust-proof boxes for the transport and storage of the wafers. Referring to FIG. 1, such a box 10 is shown comprising cover 12, box door 14, and cassette or carrier 16 within the box and supported by the box door. Cover 12 is secured to box door 14 by a latch system indicated generally by reference numerals 18. Carrier 16 comprises a plurality of shelves arranged vertically one above the other, each shelf being adapted to hold one wafer or wafer-like object.

Figure 2:
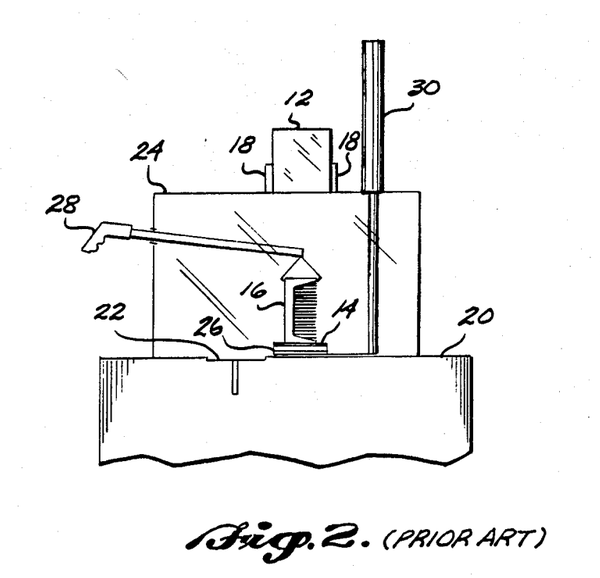
FIG. 2 is a second view of the system of FIG. 1 showing a carrier lowered into the space enclosed by the canopy.

In the SMIF system, an arbitrary processing device 20 has a carrier port 22 through which carriers can enter and leave the device. Canopy 24 is connected to device 20 overlying the carrier port, and provides an enclosed, clean environment surrounding the carrier port. Incorporated into canopy 24 is port door 26 that is constructed to support and preferably mate with box door 14. Referring to FIG. 2, box 10 can be placed on port door 26, and the latch system is then actuated, the latch system being operative to release box door 14 from cover 12, and to connect the cover to the canopy. Port door 26 is then released from canopy 24, and the port door, box door and carrier may then be lowered into the space enclosed by canopy 24 by a suitable elevator 30. Once the carrier is within the canopy, it can be manipulated by arm 28 to move the carrier to carrier port 22, or for other operations.

The movement of the wafers to and from the carrier must be done with precision. Misalignment of the wafer as it is being placed on the carrier shelves can cause damage or breakage of the wafer. In addition, a wafer that is not fully seated within the carrier can impact on the fixed structure of the processing device as the carrier is unloaded. Furthermore, it is important for security and inventory purposes to account for the wafers as they are initially loaded into the processing device and when they are finally unloaded. In stations that utilize a second carrier for placement of rejected wafers, it is also important to know which shelves, if any, are occupied when the carrier is initially loaded into the processing device in order to avoid a collision that could result by attempting to place a wafer on an occupied shelf.

SUMMARY OF THE INVENTION

The present invention provides a monitoring device for determining the presence or absence of wafer-like objects in a carrier having a plurlaity of shelves, each shelf being constructed to support one object in an orientation normal to a carrier axis. The invention may also include means for determining the precise position of each object with respect to the carrier, and means for determining whether the objects are properly seated in their shelves.

In accordance with the present invention, the monitoring device comprises a first detector that includes means for detecting movement of a body past the detector and means for generating a first detection signal corresponding to such movement. A translation member is physically coupled to the carrier, such that movement of the translation member results in movement of the carrier. Means are provided for moving the translation member such that the carrier, and any objects such as wafers supported in the carrier, move along the carrier axis past the first detector. As the translation member moves, a position signal is generated such that the position signal encodes the position of the translation member. The first detection signal and position signal are processed to determine the presence or absence of an object such as a wafer on each shelf. The invention may be incorporated in an apparatus for handling wafer-like objects in a self-contained environment.

The presence or absence of objects on each shelf may be determined by detecting the passage of a predetermined portion of the carrier past the detector, and determining therefrom the expected ranges of positions of objects in each shelf with respect to a reference point. The monitoring device may also include a second detector that includes means for detecting movement of an object past the second detector and for generating a corresponding second detection signal. In this case, the processing means includes means for processing th second detection signal, to enable an operator to determine whether the wafer is fully seated within the carrier.

DETAILED DESCRIPTION OF THE INVENTION

Figure 3:
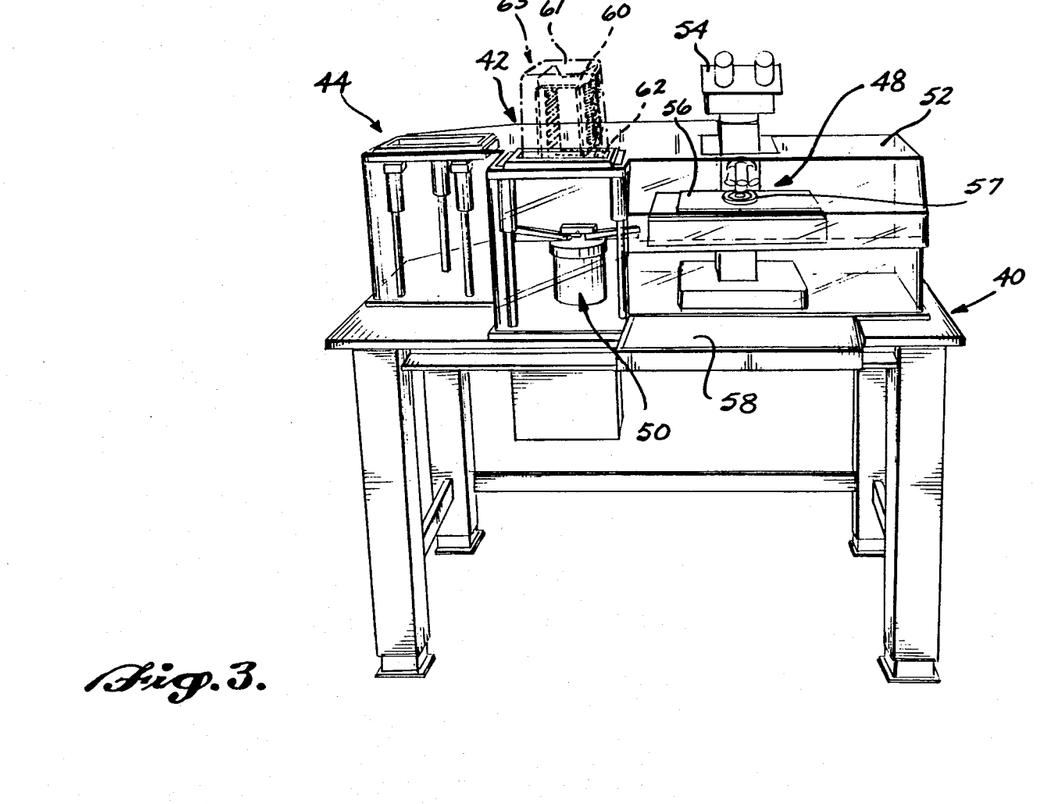
FIG. 3 is an isometric view of a wafer handling apparatus.

FIG. 3 is an isometric view of a wafer handling apparatus that is described in more detail in U.S. patent application Ser. No. 839,790, filed Mar. 13, 1986, entitled "Apparatus for Handling Sensitive Material Such As Semiconductor Wafers,", now U.S. Pat. No. 4,746,256, which application is incorporated herein by reference. The apparatus shown in FIG. 3 is mounted on table 40 that may have any suitable size, shape and construction. Positioned on table 40 are first and second port assemblies 42 and 44 respectively, microscope assembly 48 and robot assembly 50. Box 63, comprising cover 61 and base 62 enclosing carrier 60, is shown positioned on port assembly 42.

Canopy 52 is secured to table 40, and encloses all of the above-mentioned components except for the upper stage 54 of the microscope assembly. A suitable microscope assembly is the Ergolux inspection and measuring microscope available from Leitz. Such a microscope includes a motor driven turret containing five different objectives, and a viewing stage 56 that may be translated in X and Y horizontal directions. For increased convenience, the microscope assembly may be provided with a rotatable chuck 57 on stage 56. Chuck 57 may be connected to a vacuum source such that material positioned on the chuck can be securely held in position while the stage is translated horizontally. The apparatus shown in FIG. 3 also includes control panel 58 that may be used for controlling operation of the apparatus.

Although FIG. 3 illustrates an apparatus for inspecting semiconductor wafers and the like, it will readily be appreciated by those skilled in the art that the principles of the present invention apply equally to the transport of wafers or wafer-like objects to and from other wafer handling or processing equipment such as ion implanters, oxidation furnaces and the like. In such an application, the port and robot assemblies and related components would be interfaced with the appropriate equipment. The device is also applicable to devices or transferring wafers from one SMIF box to another, or between a SMIF box and a non-SMIF wafer container.

Figure 4:
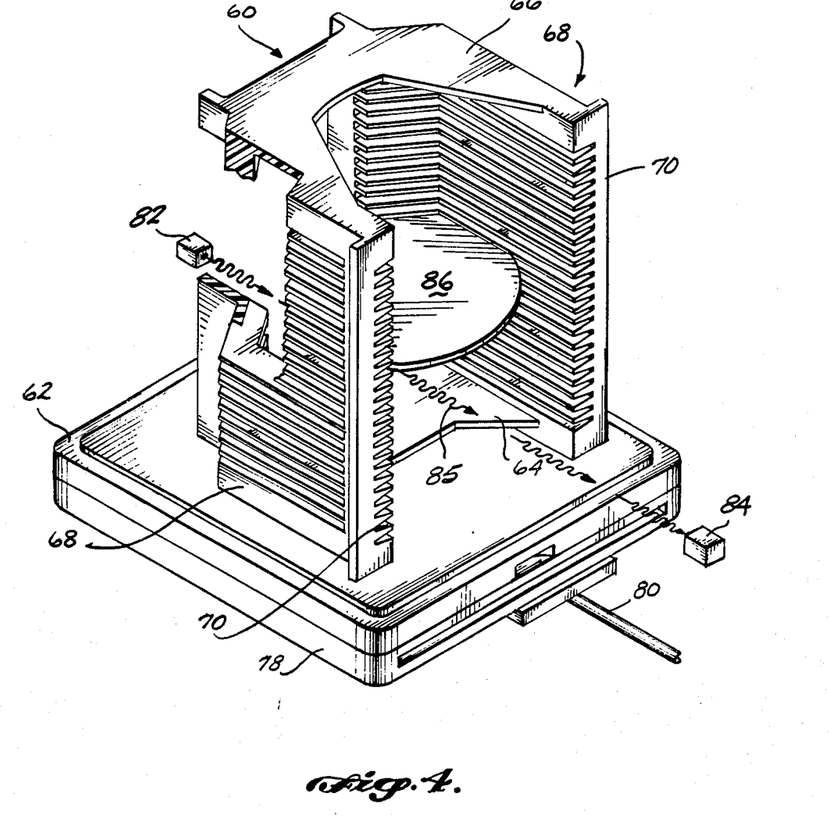
FIG. 4 is an isometric partial cut-away view of a wafer storage carrier showing a first detector.

FIG. 4 is a partial cut-away view of a carrier 60 resting on a base 62 that is in turn supported on port door 78 of port assembly 42. The carrier 60 is constructed with a horizontal cross bar 64 that partially rests on the base 62 and aids in aligning the carrier 60 on the base. The carrier includes top wall 66 that may also include a horizontal cross bar, or it may include a flat surface as is shown. The carrier further includes side walls 68 that have a plurality of shelves 70 formed on their inside surfaces. The shelves 70 are arranged vertically one above the other, and each is adapted to receive and hold one wafer or other wafer-like object, such that the wafers are parallel to one another and normal to the vertical axis of the carrier. Wafers are placed on the shelves 70 through the open front of the carrier. The back of the carrier is also open, to permit visual inspection of the wafers when they are stored in the carrier 60.

When box 63 is positioned on port assembly 42 (see FIG. 3), the carrier 60 is inside its dust-proof box and rests on the base 62. After being placed on port door 78 of the port assembly, the base 62 and the carrier 60 are lowered into the area enclosed by canopy 52 by arm 80 of robot assembly 50. The same arm 80 is used to remove wafers from the carrier and replace wafers in the carrier, and to raise carrier 60 and bsse 62 back to the dust-proof box after wafer processing is complete. FIG. 4 shows the carrier in a partially lowered or partially raised state.

The wafer monitoring device of the present invention utilizes a placement detector comprising light emitting device 82 and light detecting device 84. The light emitting and detecting devices are positioned and oriented to send light beam 85 through the open front and back of carrier 60. Both the light emitting device 82 and the light detecting device 84 are mounted to any convenient portions of port assembly 42, such that light beam 85 is interrupted by cross bar 64 and by any wafers 86 carried by shelves 70 when the carrier is raised or lowered by arm 80. Thus as the carrier 60 is lowered from its dust-proof box, light beam 85 will first be interrupted by port door 78 and base 62, then by cross bar 64, then by any wafers 86 that may be present on shelves 70, and finally by top wall 66.

Figure 5:
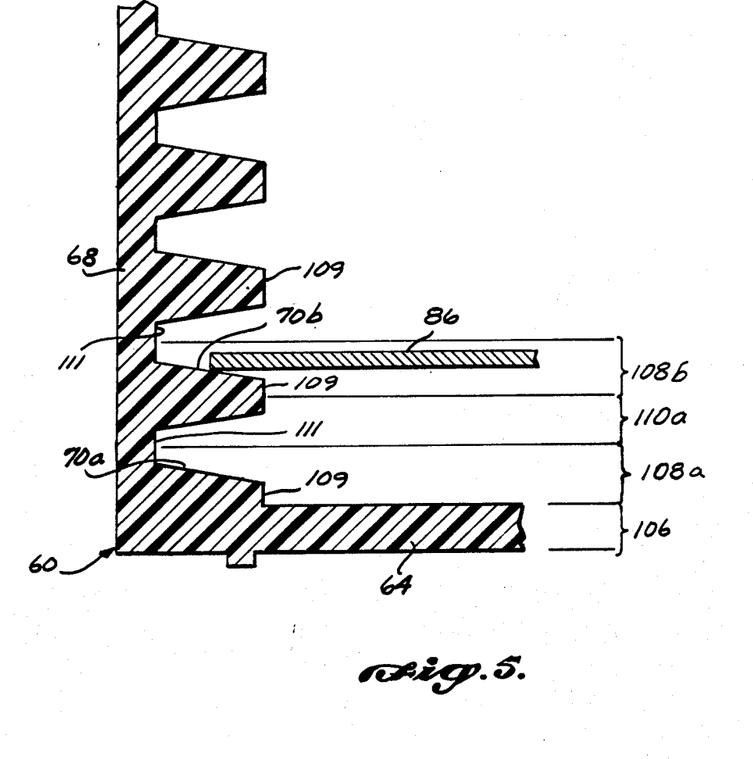
FIG. 5 is a partial sectional view of a carrier illustrating the carrier shelves in greater detail.

FIG. 5 is a partial cross-sectional view of the configuration of shelves 70 of carrier 60. Cross bar 64 is shown at the bottom of carrier 60, and a wafer 86 is shown resting on second shelf 70b. For purposes of determining the positions of wafers placed on the shelves, the control system (described below) conceptually divides the carrier into vertical segments. Cross bar segment 106 represents the thickness of cross bar 64. The space above cross bar segment 106 is divided into window segments 108 and dead band segments 110. Each window segment represents a range of vertical distance, above the cross bar segment, in which a wafer should be found, given expected manufacturing tolerances for the carrier. The dead band segments represent ranges in which no wafers should be found. In the preferred embodiment shown in FIG. 5, the boundaries between window and dead band segments are the midpoints of vertical sections 109 and 111 of sidewall 68 of the carrier.

Figure 6:
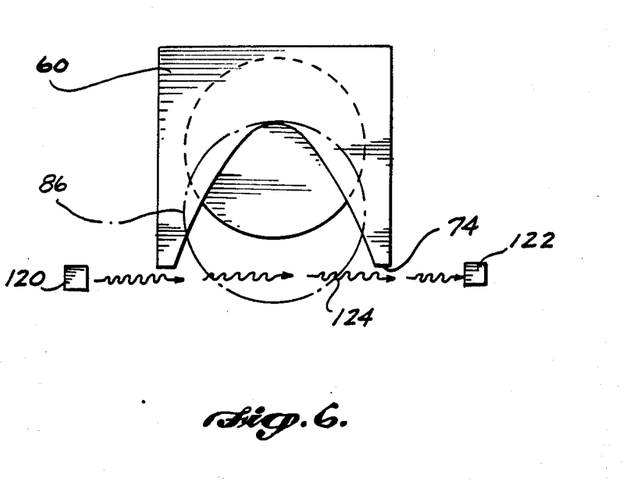
FIG. 6 is a top view of a carrier showing a second detector.

The monitoring device of the present invention preferably includes a second detector for detecting whether wafers are fully seated on their respective shelves. FIG. 6 shows a top view of carrier 60 when positioned in the wafer handling apparatus. A centering detector is placed beneath the port door (in its raised position) to detect wafers 86 that are not fully seated in their shelves in carrier 60. The centering detector comprises a second light emitting device 120 and a second light detecting device 122 that are positioned adjaent opposite sides of the carrier, and that are preferably vertically misaligned such that the light beam 124 between the light emitting device and light detecting device travels at an angle relative to the horizontal plane. Second light emitting device 120 and second light detecting device 122 are positioned so that light beam 124 travels across the open front of carrier 60, such that as carrier 60 rises from its lowered to its raised position (or vice versa) light beam 124 will be interrupted only when a wafer 86 is not fully seated in the carrier 60. When an improperly seated wafer interrupts the light beam 124, the control system (described below) stops the movement of the carrier, to prevent the wafer from colliding with the structure of the port assembly.

Figure 7:
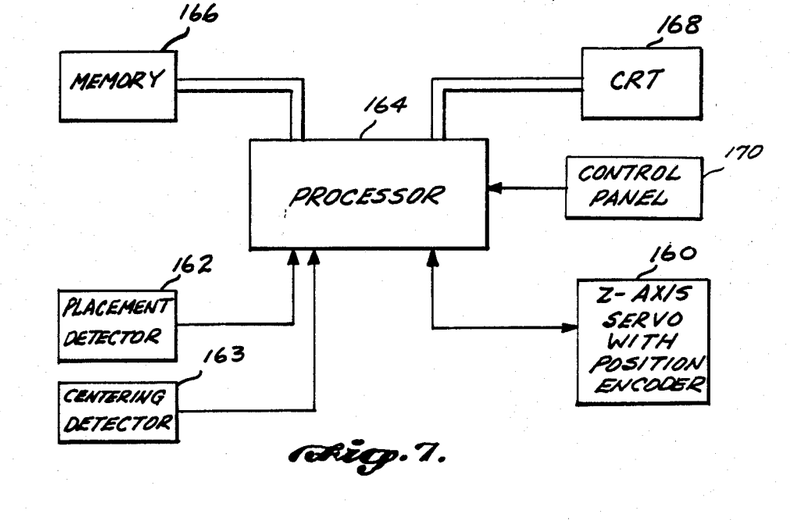
FIG. 7 is a block diagram of the control system of the monitoring device.

FIG. 7 is a simplified block diagram of a control system generally similar to the one described in greater detail in the above-referenced U.S. patent application Ser. No. 839,790. The control system includes processor 164, memory 166, Z-axis servo 160 that includes a position encoder, CRT 168 and control panel 170. CRT 168 and control panel 170 could be combined into a conventional touch screen display system. The system shown in FIG. 7 further includes placement detector 162 that comprises light emitting device 82 and light detecting device 84, and centering detector 163 that comprises light emitting device 92 and light receiving device 94. It will be understood that for a system such as the one shown in FIG. 3 in which there are two port assemblies, two placement detectors and two centering detectors will in general be provided.

During entry of a carrier into the apparatus, processor 164 receives signals from the position encoder on Z-axis (i.e. vertical axis) servo 160, and from placement detector 162. The processor uses these signals to calculate the positions of the window segments, and to determine the presence or absence of a wafer in each shelf (i.e., window segment), and stores the exact position of each wafer. These calculations preferably include conventional corrections for the acceleration or deceleration in the movement of the carrier and the time required for sending and receiving the signals. The result is a determination of the positions of the window segment for each shelf on the carrier with respect to a reference position such as the position of cross bar 64, and the position of any wafer present in the carrier with respect to the reference position. These positions may be displayed via cathode ray tube 168.

The use made of the information concerning wafer presence and wafer position will depend on the nature of the operations carried out by the equipment with which the present invention is used. In general, during a wafer fetch operation in which a wafer is to be removed from a given shelf, the processor can use he wafer presence information to indicate that a wafer is not present on a requested shelf, or that a given shelf should be skipped during a wafer processing operation. During a wafer replace operation, wafer presence information can be used to prevent the device from attempting to place a wafer on a shelf on which a wafer is already present. For both fetch and replace operations, knowledge of the exact position of each wafer can be used to guide the robot assembly to prevent breakage or improper placement.

Figure 8:
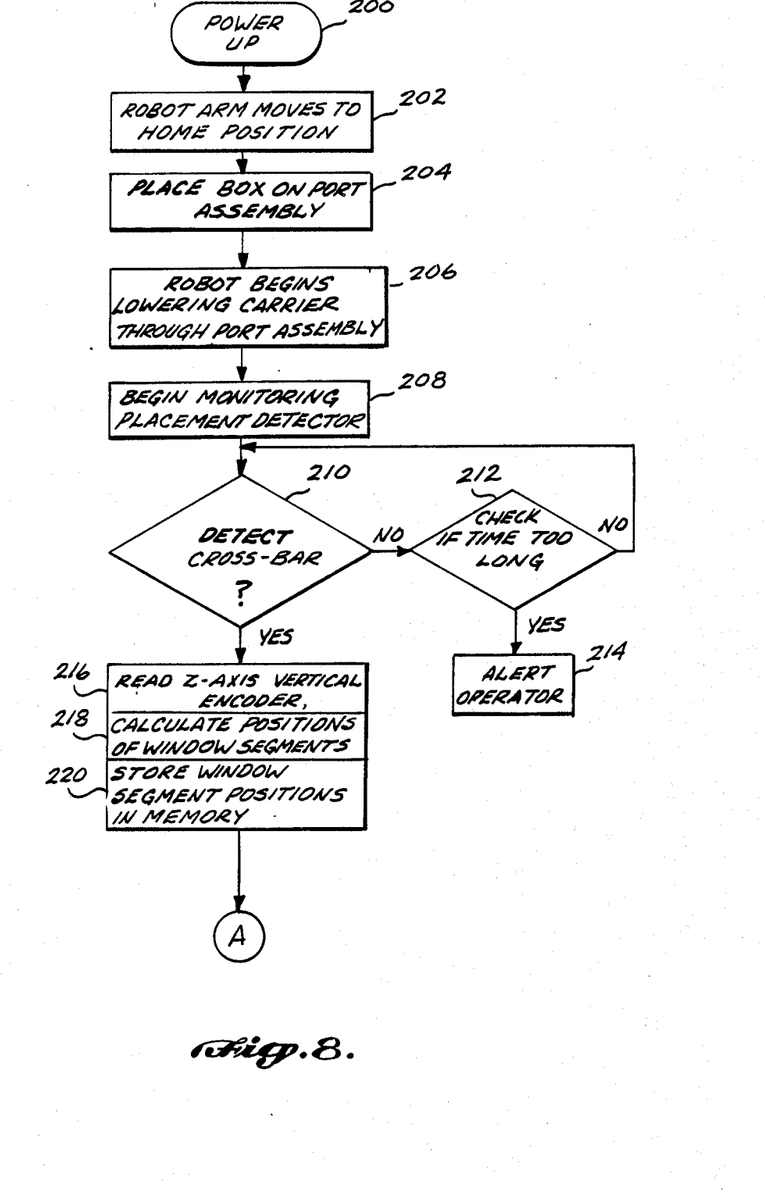
FIGS. 8 and 9 are a flow chart for a typical sequence of operations of the monitoring device.

FIG. 8 provides an exemplary flow chart for the operation of the wafer monitoring device as used in a typical wafer mapping operation. Operation is commenced upon power up in block 200, whereupon block 202 causes the robot assembly to move to a home position. The home position may be defined in any convenient manner. By way of example, the home position for the robot assembly may comprise a position in which the arm 80 is retracted, the robot is fully lowered in the Z direction, and the robot is oriented facing a given port assembly. Subsequent operations of the wafer handling device will assume a prescibed sequence of operator inputs via control panel 170. In block 204, itis assumed that the operator places a dust-proof box containing a carrier on the port assembly 42, and then causes the appropriate command to be entered to the processor. Control then passes to block 206, in which the processor commences a prescribed series of steps to lower the carrier into the space enclosed by the canopy. By way of example, such steps may comprise the following: rotate the robot assembly to face the port assembly; extend the robot arm; raise the robot assembly such that the robot arm contacts the underside of the port door 78; actuate the appropriate solenoids to unlatch base 62 from cover 61; and lower the robot assembly, thereby lowering carrier 60, base 62, and the port door 78.

In block 208, the processor begins monitoring placement detector 162 (comprising the light emitting device 82 and the light receiving device 84) to detect the interruption of light beam 85 by cross bar 64, as indicated in the decision block 210. If a predetermined length of time passes and the cross bar 64 is not detected, as shown in decision block 212, the processor causes a message to be displayed to alert the operator as shown in block 214. If the cross bar 64 is detected within the prescribed time, control then passes to block 216.

In block 216, the processor reads the Z-axis position encoder to determine the exact position of the cross bar with respect to a fixed postion on the apparatus. The processor then calculates the position of the window segments from a formula based on the configuration of the particular carrier that is used, as shown in block 218. In block 220, the processor causes the window segment positions to be stored in memory 166.

Decision block 221 shows that as the carrier continues to be lowered, the processor monitors placement detector 162 to detect the presence of wafers or the passing of the top wall 66 of the carrier. When any beam interruption is detected, control passes to decision block 222 wherein the processor determines whether the object is the top wall on the basis of the relative position of the detected object. If it is determined that the top wall has been detected, the processor transfers control to block 232 wherein the wafer positions are displayed to the operator in a suitable format.

If the top wall has not been detected, control then passes to block 224. In block 224, the Z axis position encoder is read to determine the position of the detected wafer. In block 226, the processor calculates which window segment the detected wafer is positioned in. Finally, in block 228, the processor stores the wafer position in memory 166. After the wafer position is stored, the processor determines if this is the last window segment in the carrier, as indicated in decision block 230. If not, control then transfers to decision block 221, wherein the processor continues to monitor the placement detector for other wafers or the top wall. If it is determined that the detected wafer is occupying the last available window segment in the carrier, control then passes to block 232 where the wafer positions are displayed to the operator in a suitable format, via CRT 168.

As previously described, a centering detector is used to detect wafers that are not fully seated in the carrier 60, to prevent damage or destruction of the wafer as the carrier 60 is raised out of the wafer-handling apparatus. When the operator moves the robot arm 80 into a position beneath the carrier 60 and commences raising carrier 60, input signals to the processor from the position encoder on the Z-axis servo 160 cause the processor to begin monitoring light receiving device 94 to detect an interruption of light beam 96 from light emitting device 92. Any wafer that is not fully centered within the carrier 60 will project past the open front of the carrier and interrupt light beam 96 as carrier 60 is being raised. Upon interruption of the light beam 96, the processor causes the Z-axis servo 160 to stop raising the carrier, and to then lower the carrier to its fully lowered position on table 40. After resetting the centering detector, the operator may manipulate the robot assembly to reseat the wafer or wafers that were not initially centered in the carrier. Input signals from the position encoder on the Z-axis servo 160 signal the processor when the carrier 60 is successfully raised out of the wafer-handling apparatus, at which point the processor stops monitoring the centering detector.

Figure 9:
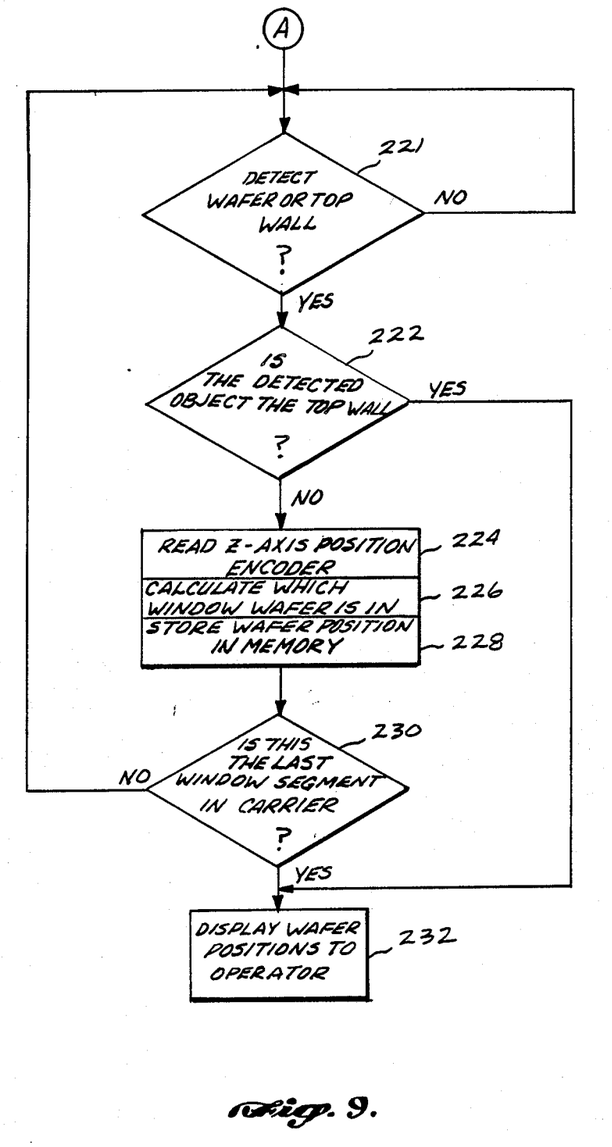

While preferred embodiments of the invention have been illustrated and described, it will be appreciated that various changes can be made therein without departing from the spirit and scope of the invention. For example, the flow chart of FIG. 9 is simply one example of the operation of a wafer monitoring device used in a typical wafer mapping operation. Consequently, the invention can be practiced otherwise than as specifically described herein.

The embodiments of the invention in which an exclusive property or privilege is claimed are defined as follows:

1. A monitoring device for determining the presence or absence of wafer-like objects in a carrier having a plurality of shelves, each shelf being constructed to support one such object in an orientation normal to a carrier axis, the device comprising:
   a first detector including means for detecting the presence of a body moving with the carrier along the carrier axis transversely past the first detector and means for generating a first detection signal corresponding to the detection of the presence of said body;
   a translation member physically coupled to said carrier such that movement of the translation member results in movement of the carrier;
   an object handler including means for removing objects from the shelves;
   movement means for moving the translation member such that the carrier and any objects supported on the carrier move along the carrier axis past the first detector;
   means for generating a position signal during motion of the translation member such that the position signal encodes the position of the translation member; and,
   processing means for processing the first detection signal and the position signal to determine the presence or absence of an object on each shelf and to enable proper handling of the objects by indexing the object handler so that it does not attempt removal of objects from shelves on which an object is absent.

2. The device of claim 1, wherein the processing means comprises means for detecting the passage of a predetermined portion of the carrier past the first detector and determining therefrom the expected ranges of positions of objects in each shelf with respect to a reference point that has a fixed position with respect to said predetermined portion, means for determining the positions of objects with respect to the reference point, and means for comparing the object positions to the expected ranges of positions to determine the presence or absence of an object on each shelf.

3. The device of claim 2, wherein the processing means further comprises a memory means for storing the expected ranges.

4. The device of claim 1, wherein the first detector comprises a light emitting device, and a light sensing device positioned to receive light from the light emitting means in the absence of an object positioned therebetween.

5. The monitoring device of claim 1, further comprising a second detector including means for detecting the presence of an object moving with the carrier transversely past the second detector and means for generating a second detection signal corresponding to detection of the presence of said object; and wherein said processing means includes means for processing the second detection signal to enable an operator to determine whether the object is fully seated within the carrier.

6. In an apparatus for handling wafer-like objects in a self contained environment, the objects being stored in a box having a cover, a bottom, means for releasably connecting and sealing the cover to the bottom, and a carrier having a plurality of shelves, each shelf being constructed to support one such object in an orientation normal to a carrier axis, the apparatus comprising a base, a canopy attached to the base so as to create an enclosed space therebetween, the canopy including a port door releasably secured to the canopy, the port door including an upper surface adapted for supporting the bottom of the box, manipulator means comprising means operable when the box has been positioned on the port door for moving the carrier out of the cover, and means operable when the carrier has been moved out of the cover for transferring the objects between the carrier and a working area within the enclosed space, an improvement comprising a monitoring device for determining the presence or absence of objects in the carrier, the monitoring device comprising:
   a first detector including means for detecting the presence of a body moving with the carrier along the carrier axis transversely past the detector and means for generating a first detection signal corresponding to detection of the presence of said body;
   a translation member associated with the manipulator means;
   movement means associated with the manipulator means for moving the translation member such that the carrier and any objects supported therein move along the carrier axis past the first detector;
   means for generating a position signal during motion of the translation member such that the position signal encodes the position of the translation member; and,
   processing means for processing the first detection signal and the position signal to determine the presence or absence of an object on each shelf and to enable proper handling of the objects by indexing the means for transferring so that said means do not attempt to transfer objects from shelves on which an object is absent.

7. The improvement of claim 6, wherein the processing means comprises means for detecting the passage of a predetermined portion of the carrier past the first detector and determining therefrom expected ranges of positions of objects in each shelf with respect to a reference point that has a fixed position with respect to the translation member, means for determining the positions of objects with respect to the reference point, and means for comparing the object positions to the expected ranges of positions to determine the presence or absence of an object on each shelf.

8. The improvement of claim 6, further comprising a second detector including means for detecting the presence of an object moving with the carrier transversely past the second detector and means for generating a second detection signal corresponding to detection of the presence of said object; and wherein said processing means includes means for processing the second detection signal to enable an operator to determine whether the object is fully seated within the carrier.

9. In an apparatus for handling wafer-like objects in a self contained environment, the objects being stored in a box having a cover, a bottom, means for releasably connecting and sealing the cover to the bottom, and a carrier having a pluralityof shelvs, each shelf being constructed to support one such object in an orientation normal to a carrier axis, the apparatus comprising a base, a canopy attached to the base so as to create an enclosed space therebetween, the canopy including a port door releasably secured to the canopy, the port door including an upper surface adapted for supporting the bottom of the box, manipulator means comprising means operable when the box has been positioned on the port door for moving the carrier out of the cover, and means operable when the carrier has been moved out of the cover for transferring the objects between the carrier and a working area within the enclosed space, an improvement comprising a monitoring device for determining whether the objects are fully seated in the carrier, the monitoring device comprising:

a first detector including means for detecting the presence of an object moving with the carrier along the carrier axis transversely past the detector and means for generating a first detection signal corresponding to detection of the presence of said object;

a translation member associated with the manipulator means;

movement means associated with the manipulator means for moving the translation member such that the carrier and any objects supported on the carrier move along the carrier axis past the detector; and, processing means for processing the first detection signal to determine whether the objects are fully seated in the carrier and for controlling the manipulator means to prevent damaging objects not fully seated in the carrier when the carrier is returned to the cover.

* * * * *